US008587376B2

(12) United States Patent
Reining

(10) Patent No.: US 8,587,376 B2
(45) Date of Patent: Nov. 19, 2013

(54) AUTOMATIC GAIN CONTROL

(75) Inventor: Friedrich Reining, Vienna (AT)

(73) Assignee: NXP, B.V., Eindhoven (NL)

(*) Notice: Subject to any disclaimer, the term of this patent is extended or adjusted under 35 U.S.C. 154(b) by 84 days.

(21) Appl. No.: 13/190,641

(22) Filed: Jul. 26, 2011

(65) Prior Publication Data

US 2012/0025908 A1 Feb. 2, 2012

(30) Foreign Application Priority Data

Jul. 29, 2010 (EP) .................................... 10171264

(51) Int. Cl.
*H03F 3/20* (2006.01)

(52) U.S. Cl.
USPC .......................................................... 330/136

(58) Field of Classification Search
USPC ......................................... 330/133, 141, 281
See application file for complete search history.

(56) References Cited

U.S. PATENT DOCUMENTS 4,461,025 A * 7/1984 Franklin ......................... 381/56
4,667,167 A * 5/1987 Kupfer .......................... 330/281
5,912,977 A 6/1999 Gottschalk-Schoenig
6,389,423 B1 5/2002 Sakakura
7,532,730 B2 * 5/2009 Waller, Jr. ..................... 381/104
2003/0044028 A1 3/2003 Cranfill et al.

FOREIGN PATENT DOCUMENTS

DE 10 2006 002019 9/2006
EP 2 009 786 A1 12/2008

OTHER PUBLICATIONS

Holters, M. et al. “Compander Systems with Adaptive Preemphasis/Deemphasis Using Linear Prediction”, IEEE Workshop on Signal Processing Systems Design and Implementation, pp. 641-645 (Nov. 2005).
Extended European Search Report for European Patent Appln. No. 10171264.4 (Dec. 16, 2010).
General Aspects of Digital Transmission Systems—Terminal Equipments—7 kHz Audio—Coding Within 64 KBIT/S, ITU-T Recommendation G.722, International Telecommunication Unit (1993).
Wikipedia, “Automatic Gain Control”, http://en.wikipedia.org/wiki/Automatic_gain_control (Oct. 13, 2011), retrieved from the Internet Jul. 25, 2013.

* cited by examiner

*Primary Examiner* — Robert Pascal
*Assistant Examiner* — Khiem Nguyen

(57) ABSTRACT

An automatic gain controller is disclosed. The AGC includes an input for monitoring a signal associated with an amplifier and a gain control circuit for controlling the gain of the amplifier in response to the monitored signal, wherein the gain control circuit is adapted to control the gain of the amplifier in accordance with a gain control function having continuously variable attack and release time constants, both of which depend on the amplitude of the monitored signal.

13 Claims, 3 Drawing Sheets

AUTOMATIC GAIN CONTROL

This application claims priority under 35 U.S.C. §119 of European patent application no. 10171264.4, filed on Jul. 29, 2010, the contents of which are incorporated by reference herein.

FIELD

This invention relates to an automatic gain controller and to a method of automatic gain control for an amplifier.

BACKGROUND

A traditional use of automatic gain control (AGC) is in an 1M radio receiver. Here, AGC is used to vary the gain of the receiver such that the output signal has an approximately constant value. This allows the receiver to operate relatively independently of the power and distance of the transmitter and to limit the effects of signal fluctuations caused by fading in the signal strength due to environmental factors.

AGC also finds use in other applications where it is desired to compress the dynamic range of a signal for transmission over a band-limited channel. AGC has the advantage over coding a signal (for example, using orthogonal frequency division multiplexing or similar techniques) that despite the fact that the coded signal can carry more information in a given time period, a signal can be compressed by AGC in real time (i.e. without introducing a delay) and bears a strong correlation to the original signal. Thus, the subjective quality of the signal is high, and it can be used as the source of audio output, for example.

An automatic gain controller will be designed to vary an amplifier's gain in response to a predefined condition (for example, gain may be limited in response to the average output signal exceeding a threshold). The AGC response is defined by two time constants: the attack time and the release time. The attack time determines how quickly the AGC responds to a high average output signal level by reducing the amplifier's gain. The release time determines how quickly the AGC allows the gain to recover to its nominal level once a transient high average output signal level has passed. Different values of these constants will be appropriate for different signal types, such as speech and music.

The decrease in gain during the attack phase is a trade-off between fast response (i.e. a quick attack) and audibility, the attack becoming more audible as the response time shortens. A fast drop in gain is acceptable for some signals, whereas for others it is not.

With respect to the release or decay phase, a long duration can lead to an unacceptable "pumping" effect, whereas an overly short release phase can cause the attack phase to initiate again, leading to the production of idle tones as the AGC cycles between attack and release phases periodically.

Typically, the attack and release time constants need to be set in the design of the automatic gain controller and cannot easily be adjusted. This makes it difficult to produce an AGC that can be used with different types of signal.

U.S. Pat. No. 5,912,977 discloses an AGC for use in a hearing aid that has a decay time constant switchable between two values depending on the amplitude of an amplifier's output. However, this is limited to a long time constant to reduce total harmonic distortion introduced by the AGC when the signal level is high and a short time constant when the signal level is low, which is required so that the amplifier of the hearing aid recovers quickly to a high value to amplify the low level signals sufficiently.

Furthermore, other signal processing algorithms such as noise cancellation and echo cancellation do not work well with AGC since they cannot detect the rapid gain changes that have been imposed by the automatic gain controller from the signal alone.

SUMMARY

In accordance with a first aspect of the invention, there is provided an automatic gain controller (AGC) comprising an input for monitoring a signal associated with an amplifier and a gain control circuit for controlling the gain of the amplifier in response to the monitored signal, wherein the gain control circuit is adapted to control the gain of the amplifier in accordance with a gain control function having continuously variable attack and release time constants, both of which depend on the amplitude of the monitored signal.

Hence, the invention provides a way by which the release time constant can adjust to suit the signal being amplified. Thus, a shorter time constant can be used with low amplitude signals, and a longer time constant with high amplitude signals. Similarly, the attack time also adapts to the signal level. The problems discussed above relating to inappropriate attack and release time constants are therefore overcome, leading to a reduction in audible artifacts.

The signal associated with the amplifier will typically be its input or its output.

In a first embodiment, the monitored signal is an output signal from the amplifier and the gain control function is equal to: $A(n-1)^{\lambda}*M(q)$, where $A(n-1)$ is a previous value of the gain of the amplifier, $\lambda$ is a constant and $M(q)$ is a gain control factor that depends on the amplitude of the monitored signal and provides the continuously variable attack and release time constants.

In a second embodiment, the monitored signal is an input signal to the amplifier and the gain control function is equal to:

$$\frac{1}{A(n-1)^{\lambda}\cdot M(q)},$$

where $A(n-1)$ is a previous value of the gain of the amplifier, $\lambda$ is a constant, and $M(q)$ is a gain control factor that depends on the amplitude of the monitored signal and provides the continuously variable attack and release time constants.

Typically, $\lambda$ will have a value in the range of 0.99 to 0.9999.

The AGC of the second embodiment is able to reverse the effects of the AGC of the first embodiment. Thus, an original signal amplified by an amplifier controlled by an AGC according to the first embodiment can be recovered by passing it through a second amplifier controlled by an AGC according to the second embodiment. Therefore, a signal can be compressed to have a lower dynamic range for transmission over a band-limited channel and then recovered using the transmitted signal alone. This allows the original signal to be recovered without transmitting any additional data to enable this so that post-processing techniques such as echo cancellation can be used.

When the first and second embodiments are combined to form a system in this way, the amplifiers should preferably be identical.

Thus, there may be provided a system comprising a first AGC according to the first embodiment for controlling the gain of a first amplifier, the input of the first AGC being coupled to the output of the first amplifier; a second AGC according to the second embodiment for controlling the gain of a second amplifier, the input of the second AGC being coupled to the input of the second amplifier; and a transmission channel coupling the output of the first amplifier to the input of the second amplifier, wherein the first and second amplifiers are substantially identical.

The combination of the first and second embodiments in this way provides a system in which differences between the gain control functions of the two embodiments is relatively unimportant, provided that the amplifiers are sufficiently similar and the gain control factors have a value near unity when no signal is being amplified. This results in a system where the differences in the two gain control functions only become apparent when the AGC is actively adjusting the gain. This will add total harmonic distortion or noise to the signal, but it will typically be much less than if the original signal were distorted by the band-limited channel or the AGC of the first embodiment was not reversed by the AGC of the second embodiment.

In a preferred embodiment, the gain control factor has a value of 1 in a mid-scale region in which the monitored signal has an amplitude between first and second predefined values and monotonically decreases towards a value of zero in lower and upper scale regions in which the monitored signal has an amplitude between negative full scale and the first predefined value and between the second predefined value and positive full scale respectively.

In this preferred embodiment, the gain control factor may be defined by: $M(q)=1-abs(q^{15})$, where q is the magnitude of the monitored signal, normalized to fall within a range of −1 to +1. The value of the exponent, 15, is just a typical value. Other values could also be used instead, typically lying in a range of 1 to 50. Indeed, other functions leading to a similar shape for M(q) when plotted against q can be used. The exact shape can be selected based on the specific characteristics of the signal to be processed.

In an alternative embodiment, the gain control factor may have a value of 1 in a mid-scale region in which the monitored signal has an amplitude between first and second predefined values and a value lower than 1 in lower and upper scale regions in which the monitored signal has an amplitude between negative full scale and the first predefined value and between the second predefined value and positive full scale respectively.

The AGC may further comprise a memory addressable using an address value based on the monitored signal to retrieve a corresponding value of the gain control factor.

In accordance with a second aspect of the invention, there is provided a method of automatic gain control for an amplifier, the method comprising monitoring a signal associated with an amplifier, and controlling the gain of the amplifier in response to the monitored signal, in accordance with a gain control function having continuously variable attack and release time constants, both of which depend on the amplitude of the monitored signal.

In a first embodiment, the monitored signal is an output signal from the amplifier (1) and the gain control function is equal to: $A(n-1)^{\lambda}*M(q)$, where A(n−1) is a previous value of the gain of the amplifier (1), λ is a constant and M(q) is a gain control factor that depends on the amplitude of the monitored signal and provides the continuously variable attack and release time constants.

In a second embodiment, the monitored signal is an input signal to the amplifier (1) and the gain control function is equal to:

$$\frac{1}{A(n-1)^{\lambda}\cdot M(q)},$$

where A(n−1) is a previous value of the gain of the amplifier (4), λ is a constant and M(q) is a gain control factor that depends on the amplitude of the monitored signal and provides the continuously variable attack and release time constants.

The method of automatic gain control of the second embodiment is able to reverse the effects of the method of automatic gain control of the first embodiment.

Thus, the first and second embodiments of the second aspect can be advantageously combined (as with the first and second embodiments of the first aspect) to form a method in which differences between the gain control functions of the two embodiments is relatively unimportant, provided that the amplifiers are sufficiently similar and the gain control factors have a value near unity when no signal is being amplified.

When the first and second embodiments are combined to form a system in this way, the amplifiers should preferably be identical.

Accordingly, there may be provided a method of transmitting a signal over a transmission channel, the method comprising controlling the gain of a first amplifier using a method according to the first embodiment, the monitored signal being the output signal of the first amplifier; transmitting the output signal from the first amplifier over the transmission channel; receiving the transmitted signal from the transmission channel at the input of a second amplifier; and controlling the gain of the second amplifier using a method according to the second embodiment, the monitored signal being the input signal to the second amplifier.

In a preferred embodiment, the gain control factor has a value of 1 in a mid-scale region in which the monitored signal has an amplitude between first and second predefined values and monotonically decreases towards a value of zero in lower and upper scale regions in which the monitored signal has an amplitude between negative full scale and the first predefined value and between the second predefined value and positive full scale respectively.

In this preferred embodiment, the gain control factor may be defined by: $M(q)=1-abs(q^{15})$, where q is the magnitude of the monitored signal, normalized to fall within a range of −1 to +1.

In another embodiment, the gain control factor has a value of 1 in a mid-scale region in which the monitored signal has an amplitude between first and second predefined values and a value lower than 1 in lower and upper scale regions in which the monitored signal has an amplitude between negative full scale and the first predefined value and between the second predefined value and positive full scale respectively.

The previous value of the amplifier's gain referred to above with respect to the first and second aspects of the invention could be a value at a predefined preceding time. If the AGC operates at discrete time intervals as will typically be the case, the previous value could be represented by an immediately preceding sample value.

BRIEF DESCRIPTION OF THE DRAWINGS

Examples of the invention will now be described in detail with reference to the accompanying drawings, in which.

DETAILED DESCRIPTION OF EMBODIMENTS

Figure 1:
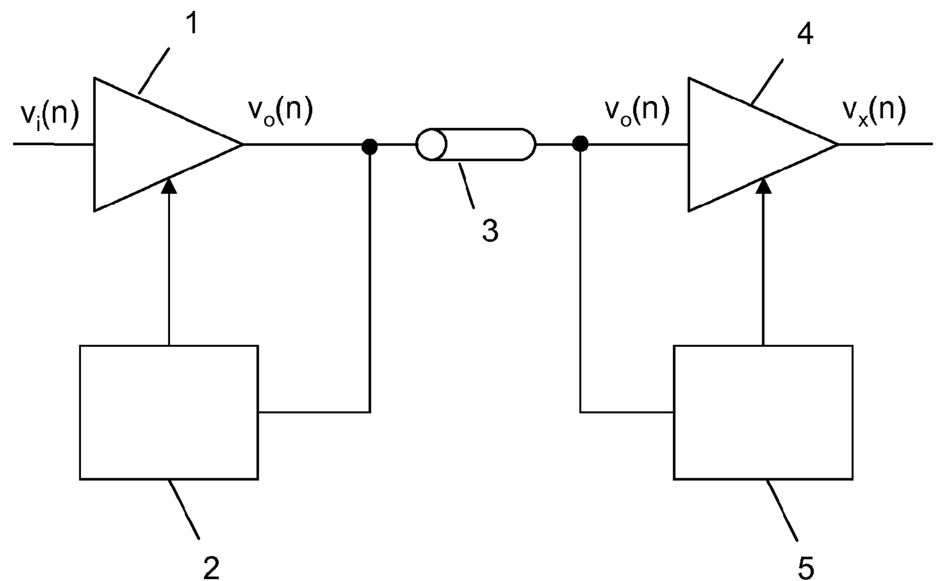
FIG. 1 shows a system applying AGC according to the invention.

FIG. 1 shows a first variable gain amplifier 1, the gain of which is controlled by an automatic gain controller (AGC) 2. The amplifier 1 receives at its input a signal voltage $v_i(n)$ and produces an output signal voltage $v_o(n)$. The AGC 2 controls the gain of amplifier 1 via a gain control input on amplifier 1 in accordance with the following gain control function:

$$A(n-1)^{\lambda * M(q)}$$

where:

A(n−1) is the gain of amplifier 1 at the immediately preceding discrete time interval;

λ is a constant with a value typically in the range 0.99 to 0.9999; and

M(q) is a gain control factor, which depends on signal level q.

Figure 2:
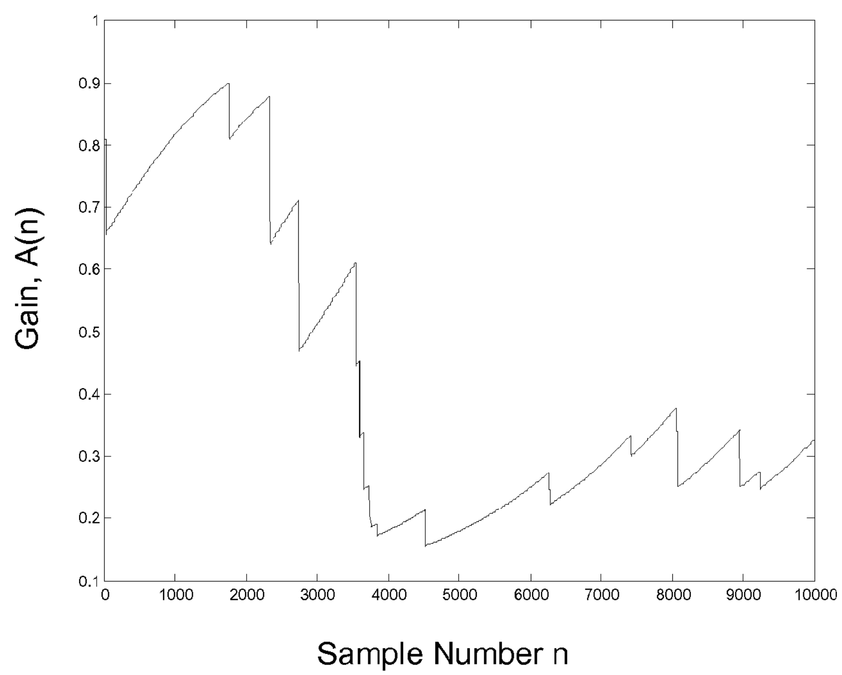
FIG. 2 shows an example of how gain might vary when controlled using an AGC according to FIG. 1.

FIG. 2 shows how the gain, A(n), of amplifier 1 might vary over time (represented by sample number) when under the control of AGC 2. In FIG. 2, the gain A(n) is expressed as a normalized value so that a value of 1 indicates the full gain available. It can be seen how the gain changes at different rates as the values of the attack and release time constants vary with the signal. For example, the release time constant is clearly lower between samples 2500 and 3500 than it is between samples 4500 and 6300.

In this embodiment, the AGC 2 operates at discrete time intervals, with n representing the current time interval. Thus, the AGC 2 will include sample-and-hold circuitry or an addressable memory to hold the value of gain, A, at the preceding time interval (n−1).

The AGC 2 controls the gain of amplifier 1 by monitoring the output voltage, $v_o(n)$, and varying the voltage on the gain control input in accordance with the above gain control function. Effectively, the AGC 2 varies the gain depending on the current value of the output voltage, $v_o(n)$.

Figure 4:
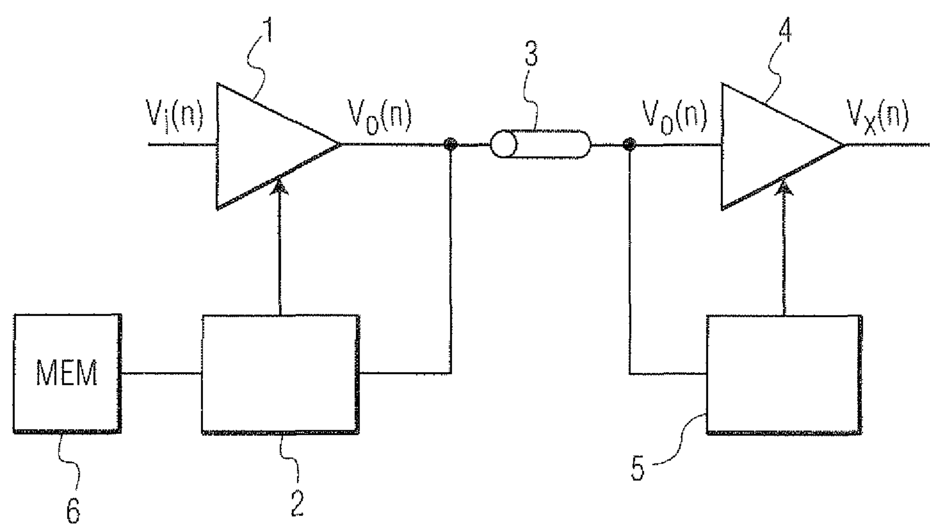
FIG. 4 shows an embodiment of FIG. 1 that uses an addressable memory.

The AGC 2 comprises circuitry, which generates values for $A(n-1)^{\lambda}$ and M(q). The gain control factor M(q) depends on the value of the signal monitored by the AGC 2, in this case output voltage $v_o(n)$. The values of M(q) could be stored in a memory 6, as shown in FIG. 4, which is addressable using an address value based on the monitored signal to retrieve a corresponding value of the gain control factor.

There are many possible transfer functions that could be used as the gain control factor, M(q). The particular transfer function chosen will depend on the characteristics of the signal being amplified and the desired compression of the dynamic range. One example could be implemented using a simple digital switch, which sets M(q) to one value if the output voltage $v_o(n)$ is below a threshold and to a different value (to reduce the gain of amplifier 1) if the output voltage $v_o(n)$ is equal to or greater than the threshold.

Figure 3A:
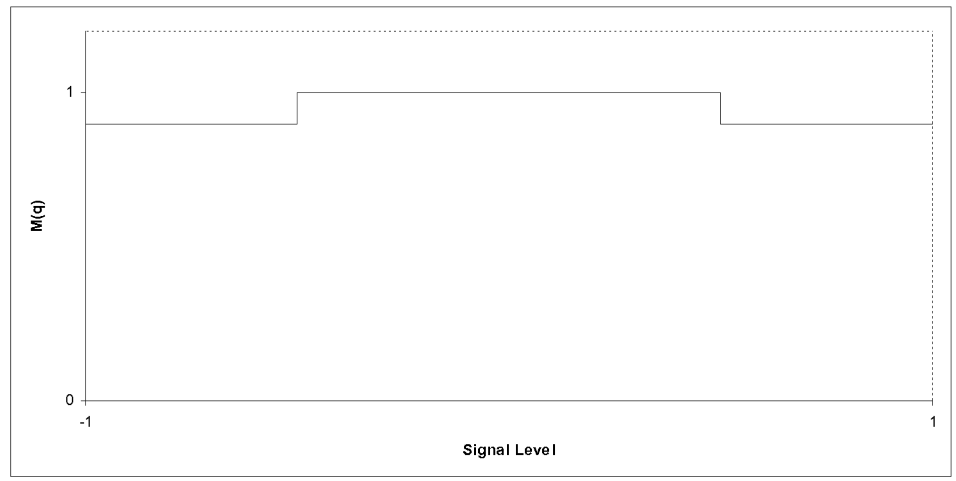
FIGS. 3*a* and 3*b* show graphs of suitable gain control factors.

An example of such a thresholding function is shown in FIG. 3*a*. In this, the value of M(q) is equal to 1 (or very nearly 1) when the output voltage $v_o(n)$ (i.e. the input to AGC 2) is in a mid-scale region. However, when the output voltage $v_o(n)$ is outside the mid-scale region either in a negative full-scale or a positive full-scale region, the value of M(q) becomes 0.9 (or very nearly 0.9). The value of M(q) that is chosen for the negative and positive full-scale regions (0.9 in this case) will depend on the desired degree of compression required and on the expected signal characteristics.

Figure 3B:
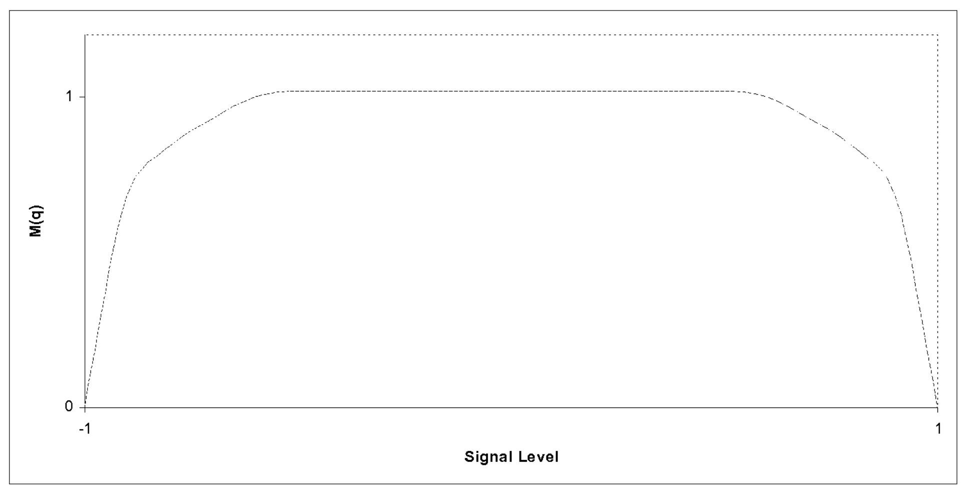

FIG. 3*b* shows another example of a transfer function. In this example, the value of M(q) is equal to 1 (or very nearly 1) when the output voltage $v_o(n)$ (i.e. the input to AGC 2) is in a mid-scale region. However, as the output voltage $v_o(n)$ departs from the mid-scale region either towards a negative full-scale or a positive full-scale region, the value of M(q) monotonically decreases towards 0. This provides a gradual decrease in gain as the output voltage signal reaches high values in either a positive or negative direction.

A suitable equation for calculating M(q) in the example of FIG. 3(*b*) is: $M(q)=1-\text{abs}(q^{15})$, where q is the magnitude of the monitored signal, normalized to fall within a range of −1 to +1.

In some circumstances, it will be desired to reverse the effects of AGC 2 after transmission over channel 3, for example if post-processing such as echo or noise cancellation is to be performed on the signal. The combination of amplifier 4 and AGC 5 does this. AGC 5 is similar to AGC 2, the only difference being that it uses the reciprocal of M(q) as the gain control factor. Thus, AGC 5 controls the gain of amplifier 4 via a gain control input on amplifier 4 in accordance with the following gain control function:

$$\frac{1}{A(n-1)^{\lambda} \cdot M(q)},$$

Thus, amplifier 4 and AGC 5 in combination can recover the original signal from the output signal from amplifier 1 alone. For this purpose, the amplifiers 1 and 4 should preferably be identical. The resultant output signal from amplifier 4 can be used in post-processing techniques such as noise and echo cancellation.

The values of the reciprocal of M(q) for each value of signal level can be calculated in advance and stored in a memory. The appropriate value of M(q) can then be retrieved when required by addressing the memory depending on the value of signal level.

The AGC 5 comprises circuitry, which generates or looks up values for the reciprocal $A(n-1)^{\lambda}$ and multiplies this by the reciprocal of M(q) to determine the gain control function.

In the above equations, the value of M(q) determines the attack and release time constants of the AGC algorithm. This is best understood by way of example. If, for example, the input signal level to amplifier 1 increases to a high value very rapidly (such as a step function input) then, using the gain control function of FIG. 3*a*, it will take many cycles of operation of the AGC 2 to reach an appropriate value for the gain so that the signal is attenuated as desired. On the other hand, using the gain control function of FIG. 3*b*, the change in gain may take only a few steps to bring about the required attenuation. In each case, the number of steps required to bring about the required attenuation depends on the signal characteristics, such as its level and rate of change. This means that the gain control function M(q) causes the attack time to be signal dependent.

A similar situation occurs with respect to control of the release time constant. Typically, the release time constant will be longer for the gain control function of FIG. 3*b* than it will for that of FIG. 3*a*, although it will typically take many cycles of operation in either case. Again, the exact length of the release time depends on the signal characteristics, such as its level and rate of change. This means that the gain control function M(q) causes the release time to be signal dependent.

If the release time is sufficiently short (e.g., a few milliseconds) any mismatches (due, for example, to differences in AGCs 2 and 5 or bit error failures that occur in the channel 3) are smeared over time and are, therefore, not particularly audible as they would be without the AGC algorithm presented herein. This is because a bit error or signal error will result in a mismatch of the gain factor applied by AGC 2 to that applied by AGC 5. Since the finite value of release time causes the influence of this mismatch to endure during the release phase, the signal effectively adapts to the error, smoothing it out, and making it less audible.

The shape of the function M(q) determines the entropy of the signal processed by a combination of amplifier 1 and AGC 2, the attack-release behavior, and the robustness against the errors on the channel 3.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. A single processor or other unit may fulfill the functions of several items recited in the claims. The mere fact that certain measures are recited in mutually different dependent claims does not indicate that a combination of these measures cannot be used to advantage. Any reference signs in the claims should not be construed as limiting the scope.

The invention claimed is:

1. An automatic gain controller (AGC) comprising:

an input configured to monitor a signal associated with an amplifier; and a gain control circuit configured to control a gain of the amplifier in response to the monitored signal in accordance with a gain control function having continuously variable attack and release time constants, both of which depend on an amplitude of the monitored signal, wherein the monitored signal is an input signal to the amplifier and the gain control function is equal to:

$$\frac{1}{A(n-1)^{\lambda} \cdot M(q)},$$

A(n−1) is a previous value of the gain of the amplifier, λ is a constant, and M(q) is a gain control factor that depends on the amplitude of the monitored signal and provides the continuously variable attack and release time constants.

2. The AGC according to claim 1, wherein the monitored signal is an output signal from the amplifier, the gain control function is equal to $A(n-1)^{\lambda}*M(q)$, A(n−1) is a previous value of the gain of the amplifier, λ is a constant, and M(q) is a gain control factor that depends on the amplitude of the monitored signal and provides the continuously variable attack and release time constants.

3. The AGC according to claim 2, wherein the gain control factor has a value of 1 in a mid-scale region in which the monitored signal has an amplitude between first and second predefined values and monotonically decreases toward a value of zero in lower and upper scale regions in which the monitored signal has an amplitude between a negative full scale and the first predefined value and between the second predefined value and a positive full scale respectively.

4. The AGC according to claim 3, wherein the gain control factor is defined by $M(q)=1-abs(q^{15})$, where q is the magnitude of the monitored signal and is normalized to fall within a range of −1 to +1.

5. The AGC according to claim 2, wherein the gain control factor has a value of 1 in a mid-scale region in which the monitored signal has an amplitude between first and second predefined values and a value lower than 1 in lower and upper scale regions in which the monitored signal has an amplitude between negative full scale and the first predefined value and between the second predefined value and positive full scale respectively.

6. The AGC according to claim 2, further comprising:

a memory addressable using an address value based on the monitored signal to retrieve a corresponding value of the gain control factor.

7. A system comprising a first AGC comprising an input configured to monitor a signal associated with an amplifier, and a gain control circuit configured to control a gain of the amplifier in response to the monitored signal in accordance with a gain control function having continuously variable attack and release time constants, both of which depend on the amplitude of the monitored signal, wherein the monitored signal is an output signal from the amplifier and the gain control function is equal to $A(n-1)^{\lambda}*M(q)$, where A(n−1) is a previous value of the gain of the amplifier, λ is a constant, and M(q) is a gain control factor that depends on the amplitude of the monitored signal and provides the continuously variable attack and release time constants for controlling the gain of a first amplifier, the input of the first AGC being coupled to the output of the first amplifier;

a second AGC configured to control a gain of a second amplifier, the input of the second AGC being coupled to the input of the second amplifier; and a transmission channel configured to couple the output of the first amplifier to the input of the second amplifier, wherein the first and second amplifiers are substantially identical.

8. A method of automatic gain control for an amplifier, the method comprising:

monitoring a signal associated with an amplifier, and controlling a gain of the amplifier in response to the monitored signal, in accordance with a gain control function having continuously variable attack and release time constants, both of which depend on an amplitude of the monitored signal, wherein the monitored signal is an input signal to the amplifier, the gain control function is equal to:

$$\frac{1}{A(n-1)^{\lambda} \cdot M(q)},$$

A(n−1) is a previous value of the gain of the amplifier, λ is a constant, and M(q) is a gain control factor that depends on the amplitude of the monitored signal and provides the continuously variable attack and release time constants.

9. The method of automatic gain control according to claim 8, wherein the monitored signal is an output signal from the amplifier, the gain control function is equal to $A(n-1)^{\lambda}*M(q)$, A(n−1) is a previous value of the gain of the amplifier, λ is a constant, and M(q) is a gain control factor that depends on the amplitude of the monitored signal and provides the continuously variable attack and release time constants.

10. The method of automatic gain control according to claim 9, wherein the gain control factor has a value of 1 in a mid-scale region in which the monitored signal has an amplitude between first and second predefined values and monotonically decreases towards a value of zero in lower and upper scale regions in which the monitored signal has an amplitude between negative full scale and the first predefined value and between the second predefined value and positive full scale respectively.

11. The method of automatic gain control according to claim 10, wherein the gain control factor is defined by: $M(q)=1-abs(q^{15})$, where q is the magnitude of the monitored signal, normalized to fall within a range of −1 to +1.

12. The method of automatic gain control according to claim 9, wherein the gain control factor has a value of 1 in a mid-scale region in which the monitored signal has an amplitude between first and second predefined values and a value lower than 1 in lower and upper scale regions in which the monitored signal has an amplitude between negative full scale and the first predefined value and between the second predefined value and positive full scale respectively.

13. A method of transmitting a signal over a transmission channel, the method comprising controlling a gain of a first amplifier using a method comprising:

monitoring a signal associated with the first amplifier, and controlling the gain of the first amplifier in response to the monitored signal, in accordance with a gain control function having continuously variable attack and release time constants, both of which depend on the amplitude of the monitored signal, wherein the monitored signal is an output signal from the first amplifier, the gain control function is equal to $A(n-1)^{\lambda}*M(q)$, A(n−1) is a previous value of the gain of the amplifier, λ is a constant, and M(q) is a gain control factor that depends on the amplitude of the monitored signal and provides the continuously variable attack and release time constants, the monitored signal being the output signal of the first amplifier;

transmitting the output signal from the first amplifier over the transmission channel;

receiving the transmitted signal from the transmission channel at the input of a second amplifier; and controlling the gain of the second amplifier, the monitored signal being the input signal to the second amplifier.

* * * * *